(12) United States Patent
Babcock et al.

(10) Patent No.: US 6,358,843 B1
(45) Date of Patent: Mar. 19, 2002

(54) METHOD OF MAKING ULTRA SMALL VIAS FOR INTEGRATED CIRCUITS

(75) Inventors: Carl P. Babcock, Campbell; Bhanwar Singh, Morgan Hill, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/824,421

(22) Filed: Apr. 2, 2001

(51) Int. Cl.[7] .......................................... H01L 21/4763
(52) U.S. Cl. ..................... 438/637; 438/638; 438/640; 438/666; 438/668
(58) Field of Search .............................. 438/637–8, 640, 438/666, 668

(56) References Cited

U.S. PATENT DOCUMENTS

| | | | | |
|---|---|---|---|---|
| 4,933,714 A | * | 6/1990 | Buckley et al. | 355/43 |
| 5,219,787 A | * | 6/1993 | Carey et al. | 438/637 |
| 5,667,941 A | * | 9/1997 | Okamoto et al. | 430/313 |
| 5,798,195 A | * | 8/1998 | Nishi | 430/22 |
| 5,976,968 A | * | 11/1999 | Dai | 438/637 |
| 6,127,255 A | * | 10/2000 | Suguira et al. | 438/668 |
| 6,127,734 A | * | 10/2000 | Kimura | 257/774 |
| 6,133,138 A | * | 10/2000 | Ishibashi | 438/637 |
| 6,150,256 A | * | 11/2000 | Furukawa et al. | 438/637 |
| 6,174,801 B1 | * | 1/2001 | Tzu et al. | 438/637 |
| 6,191,034 B1 | * | 2/2001 | Klein et al. | 438/637 |
| 6,204,187 B1 | * | 3/2001 | Rupp et al. | 438/637 |

\* cited by examiner

Primary Examiner—John F. Niebling
Assistant Examiner—Lynne A. Gurley
(74) Attorney, Agent, or Firm—Foley & Lardner

(57) ABSTRACT

A method of fabricating ultra small vias in insulating layers on a semiconductor substrate for an integrated circuit by a first exposure of a photoresist to line pattern with the semiconductor substrate in a first position and the exposure dosage being insufficient to develop the photoresist followed by a second overlapping exposure of the line pattern with the semiconductor substrate being in a position 90° from the first position and again being insufficient in exposure dosage to develop the photoresist, the overlapped line exposures creating via exposures of sufficient dosage to develop the photoresist, thereby creating a smaller via opening than with a single exposure.

8 Claims, 4 Drawing Sheets

METHOD OF MAKING ULTRA SMALL VIAS FOR INTEGRATED CIRCUITS

CROSS-REFERENCE TO RELATED APPLICATION

The application claims the benefit of U.S. Provisional application No. 60/275,745.

FIELD OF THE INVENTION

The present invention relates to fabricating an integrated circuit, containing interconnecting lines with vertical connectors of vias, and, more specifically, to fabricating interconnecting lines with ultra small vias.

BACKGROUND OF THE INVENTION

The fabrication of integrated circuits devices are well known and are manufactured by fabricating a plurality of transistors, such as field effect transistors (FET) and passive devices on and in a semiconductor substrate, such as silicon. In the case of an FET, a gate material, such as polysilicon, is disposed over a relatively thin gate insulator, such as silicon oxide on and in a semiconductor substrate. The gate material and gate insulator are patterned to form gate conductors, and impurities are deposited adjacent to and on opposite sides of the gate conductors to dope the gate material and to form source/drain regions of either N-type or P-type depending on the type of impurity. If the impurity is N-type, then the resulting FET is an NMOS with an N-channel and, if the impurity is a p-type, then the resulting FET is a PMOS with a P-channel. In addition, if the device contains both an NMOS and a PMOS, the device is a CMOS.

With the increased need to fabricate more complex and higher levels of integrated circuits with faster transistors, such as FETs, it has become necessary to reduce the dimensions of the interconnections between the transistors and especially the vertical connections or vias between the connecting lines.

However, a reduction in the physical dimensions of the connectors or vias between the connection lines is limited by conventional photolithographic techniques used to define the hole for the vertical connector. Photolithography is used to pattern a photoresist, which is disposed above an insulating material. Silicon oxide typically is used as the insulating material to separate the conductive lines. An optical image is transferred to and exposes the photoresist by projecting radiation, normally deep ultraviolet light through the transparent portions of a mask plate containing the layout and dimensions of the holes for the vertical connectors. Depending on whether the photoresist is positive or negative, the solubility of the exposed photoresist is either increased or decreased by a photochemical reaction. The photoresist is developed by dissolving the resist areas of higher solubility with a solvent, leaving a mask pattern on the insulating material, such as silicon oxide. This mask pattern protects the underlying insulating material during etching of the material to define the shape and dimension of the vertical conductor or via in the insulating layer of the integrated circuit.

Thus, the overlying photoresist pattern defines the dimensions of vertical holes or vias in the insulating material. The minimum dimension that can be achieved for a patterned photoresist is limited by the resolution of the optical system used to project the image onto the photoresist.

Therefore, it would be desirable to develop a fabrication method in which the physical dimensions of holes or vias in insulating material can be made smaller while still using a conventional photolithographic system.

SUMMARY OF THE INVENTION

Accordingly, it is an object of the present invention to provide a method of fabricating an integrated circuit with a hole or via which uses a photolithographic system but employs a technique to achieve smaller dimensions.

Another object of the present invention is to provide a method of fabricating an integrated circuit with ultra small holes or vias with minimal modification to the photolithographic system.

A semiconductor material, such as a silicon wafer, is fabricated with a very large number of transistors, such as FETs, and, if desired, passive elements. An insulating layer is disposed over the transistors and passive elements. A photoresist layer is disposed on the insulating layer, and the resist is first exposed to a conventional deep ultra violet light pattern and then exposed to the same light pattern but with the pattern and wafer rotated ninety degrees (90°) relative to each other and the two pattern exposures overlapping each other. Each exposure dose is not sufficient to develop the non-overlapped resist exposure pattern but is sufficient to develop the smaller overlapped exposure pattern.

BRIEF DESCRIPTION OF THE DRAWINGS

The foregoing and other objects, aspects and advantages will be better understood from the following detailed description of a preferred embodiment of the invention with reference in the drawings, in which.

DETAILED DESCRIPTION OF THE PREFERRED EMBODIMENTS

Figure 1:
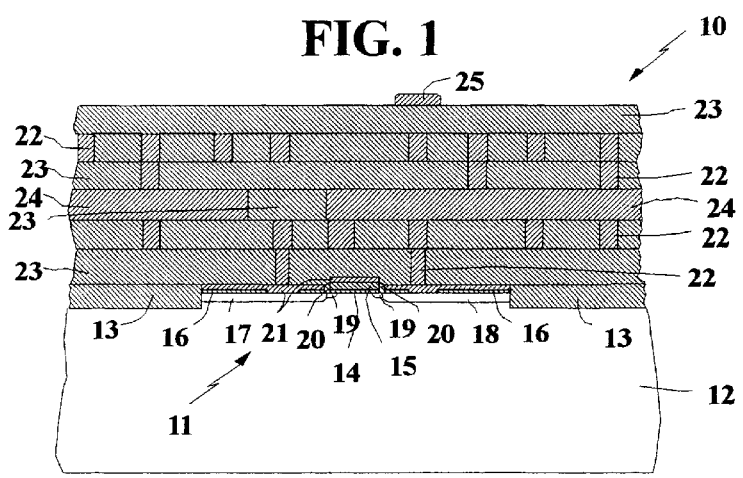
FIG. 1 is a cross-sectional view of a portion of an integrated circuit with an FET and conductive lines interconnected by vias fabricated by the process of the present invention.

Normally an integrated circuit 10 employing the interconnecting lines of the present invention will include a field effect transistor (FET) 11 as shown in FIG. 1. A semiconductor substrate 12, such as a silicon wafer, preferably with a {100} plane orientation, is doped with an appropriate impurity depending on whether the FETs are to be N-type or P-type. If the devices are to be complementary N-type and P-type, such as a complementary metal oxide silicon (CMOS) device, selected portions of the wafer 12 will be doped with an appropriate impurity to form wells in the complementary areas. To simplify the description of the present invention, the preferred embodiment of the integrated circuit is an N-type FET and the wafer 12 is doped with a P-type impurity herein boron (B) isolated by trenches 13. Also shown in FIG. 1, an insulating layer 14, which will function as the gate insulator after the FET is fabricated, is formed on the surface of the wafer 12 and preferably is thermally grown silicon oxide. On the gate insulating layer 14 is deposited a material, which will function as the gate electrode in the completed FET, and, herein, it is polysilicon 15 which may doped with an impurity either during or after deposition to lower the resistivity of the polysilicon and make it conductive. Preferably, the doping of the polysilicon 15 is after deposition and with an N-type impurity, such as arsenic (As), during the formation of the source and drain of the N-type FET. A thin screen oxide 16 preferably is grown prior to implantation of impurities for the source and drain. The oxide also grows a thin layer on the exposed polysilicon sides and repairs any damage to the polysilicon and gate oxide under the polysilicon caused by etching. Once, the gate electrode is formed, impurities are implanted to create the source 17 and drain 18. Because of the short channel of the FET, it is preferable to first implant a lightly doped drain (LDD) 19 as part of the source and drain.

N-type impurities, herein phosphorus (P) are implanted into the silicon substrate 12 with the gate 15 and gate insulator 14 serving as an alignment mask to implant phosphorus ions between the gate and the walls of the trenches 13. Since implant is shallow for the LDD, the dosage parameters for the implant is about $1 \times 10^{13}$ cm$_{-2}$ at energies of 40–60 keV. A conformal layer of silicon oxide which is deposited and anisotropically etched to form sidewalls 20 is used to mask those parts of the silicon wafer to which N-type ions, herein arsenic (As) ions, are implanted to form the source 17 and drain 18. The dosage for this implant is $5 \times 10^{15}$ cm$_{-2}$ at energies of 40–80 keV. The gate electrode 15, herein polysilicon, can be doped with the N-type dopant at the same time as implanting the source and drain.

To enhance the conductivity of the gate 15 and the contact interface of the source 17 and drain 18 with the implanted ions, a metal capable of forming a metal silicate 21, herein titanium (Ti), is blanket deposited as a thin layer of thickness of preferably from about 350 angstroms (Å) to about 500 Å. A rapid thermal anneal at 650° C. for about 15 minutes causes the titanium to react with the silicon wafer 12 and the implanted impurities to activate and diffuse vertically and laterally in the silicon with the resultant profiles as shown in FIG. 1. The unreacted Ti on the trenches and sidewalls is removed by an etchant, herein a sulfuric acid/hydrogen peroxide mixture. Alternatively, ammonium hydroxide may be used.

An insulating material 23 is deposited over the silicon wafer 12 and planarized by chem/mech polish. Contact holes are anisotropically etched in the insulating material and preferably a liner (not shown) such as Ti/TiN is CVD deposited to line the contact holes followed by filling the holes with a metal 22, such as tungsten, to contact a metallization layer of, for example, aluminum (Al), as exemplified by metal layers 24. The surface of the silicon wafer is again planarized by chem/mech polish and repeated for the desired number of interconnection layers. A pad 25 is shown on the top of the portion of the integrated circuit 10 for interconnecting to a circuit board. As is well known in the art, patterned metallization layers and insulating layers are formed by using a photoresist mask to interconnect the circuits of the integrated circuit chips or dies to complete the fabrication of the silicon wafer prior to dicing into individual chips. The number of interconnect layers will depend on the circuit density of the integrated circuit on the individual chips or dies of the silicon wafer. With increased density, reducing the dimensions of the connecting lines and vias becomes more important.

Figure 2:
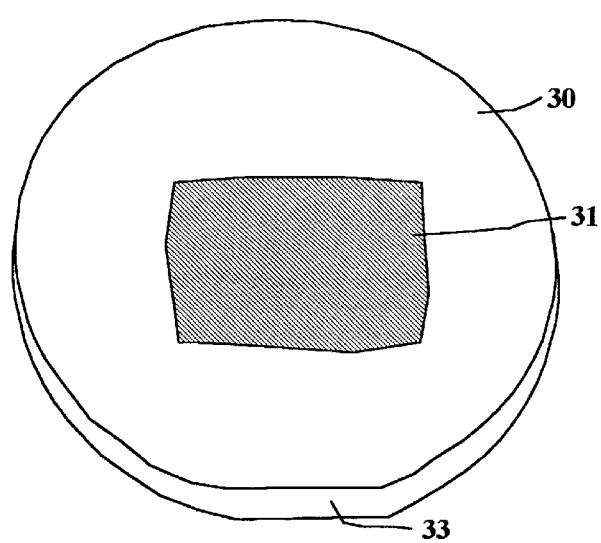
FIG. 2 is a plan view of a semiconductor wafer having a flat on the lower part of the wafer and with a portion of an insulating layer disposed on its surface and overlying conductive interconnection lines (not shown).
Figure 3:
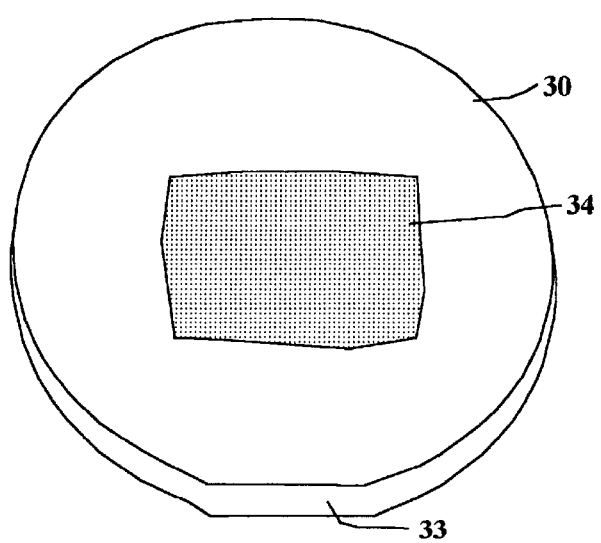
FIG. 3 is a plan view of the wafer of FIG. 2 having a photoresist layer disposed on the portion of the insulating layer FIG. 2.

The reduction in the size of vias is accomplished in accordance with one exemplary embodiment by starting with a silicon wafer 30 carrying an insulating layer 31, such as silicon oxide, as shown in FIG. 2, overlying one or more conductive lines 32 (not shown) of either polysilicon or metal. A flat 33 on the lower portion of the wafer is used to position the wafer in a photolithographic system. As shown in FIG. 3, a commercially available deep ultra violet (DUV) photoresist layer 34 is deposited on the insulating layer 32.

Figure 4:
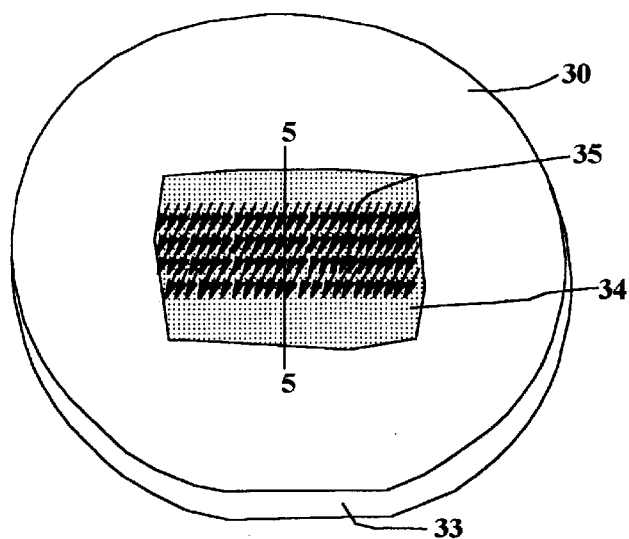
FIG. 4 is a plan view of the wafer of FIG. 3 having the flat on its lower part and with the portion of the photoresist layer being exposed to line patterns as depicted by the four sets of arrows.
Figure 5:
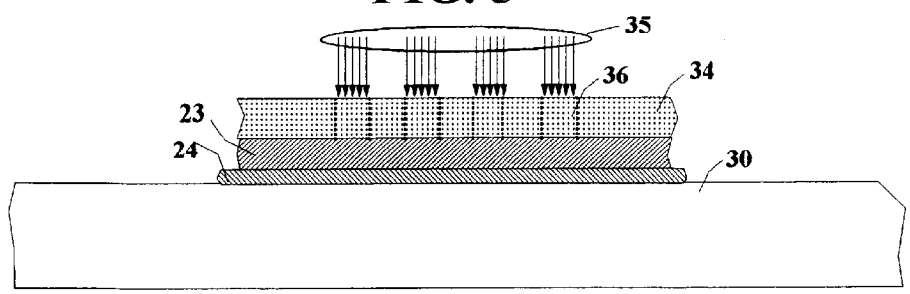
FIG. 5 is a cross-sectional view taken along line 5—5 of FIG. 4 and showing the exposure of the photoresist by the four sets of arrows.
Figure 6:
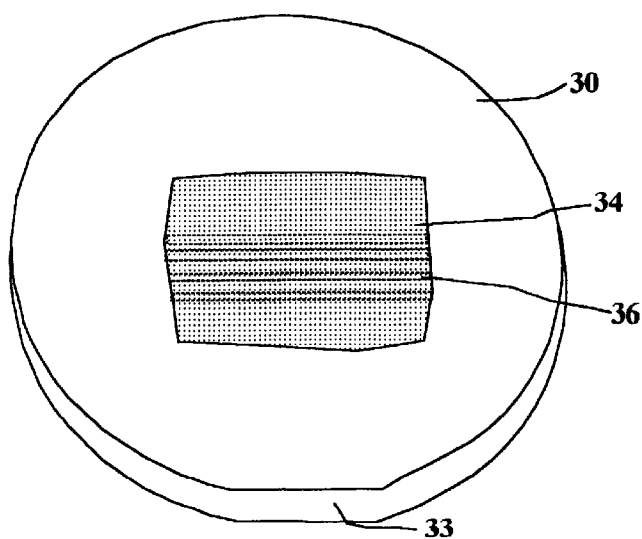
FIG. 6 is a plan view of the wafer of FIG. 4 and 5 with the exposed but not developed line areas indicated by dashed lines in the photoresist portion.
Figure 7:
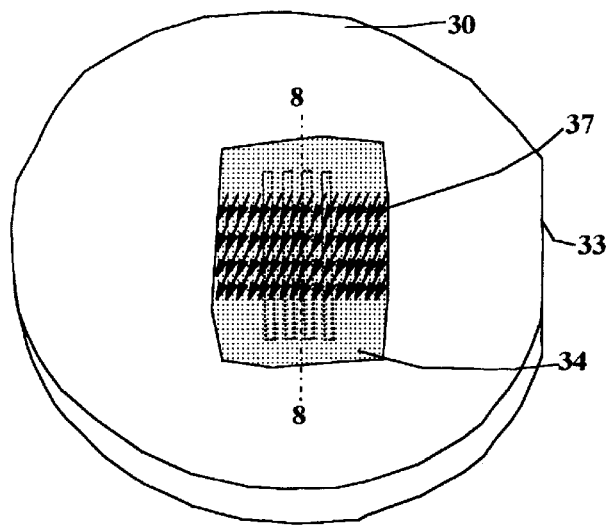
FIG. 7 is a plan view of the wafer of FIG. 6 but with the wafer rotated 90° so that the flat of the wafer is on the right side of the drawing and showing the portion of the photoresist being exposed to the same line pattern of FIG. 4 but in an overlapping fashion as depicted by the four sets of arrows.
Figure 8:
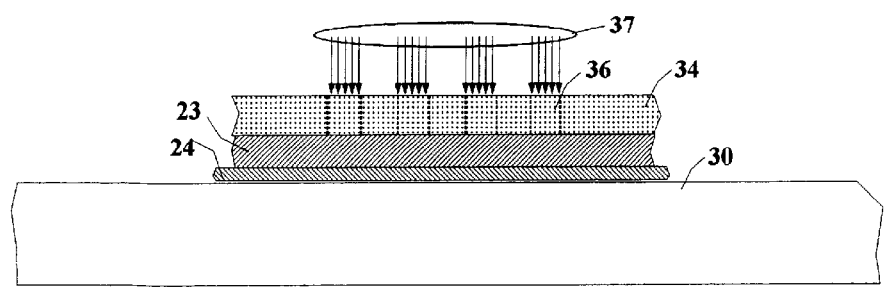
FIG. 8 is a cross-sectional view of the wafer of FIG. 7 taken along line 8—8 of FIG. 7 and showing the exposure of the photoresist by the four sets of arrows.
Figure 9:
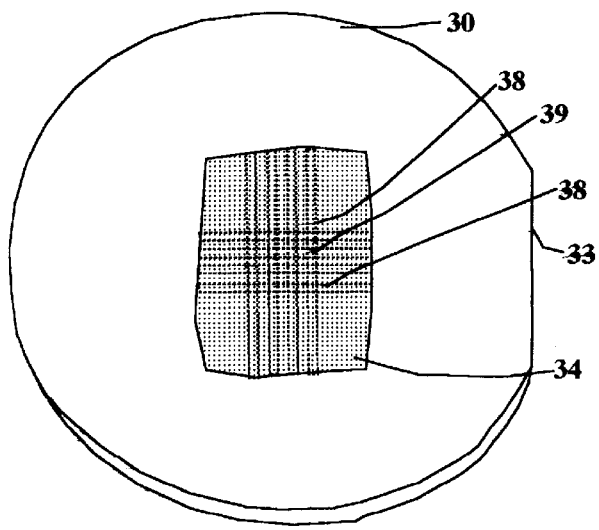
FIG. 9 is a plan view of the wafer of FIG. 7 and 8 with the portion of photoresist showing the overlapping exposure areas of FIGS. 4, 5, 7 and 8.
Figure 10:
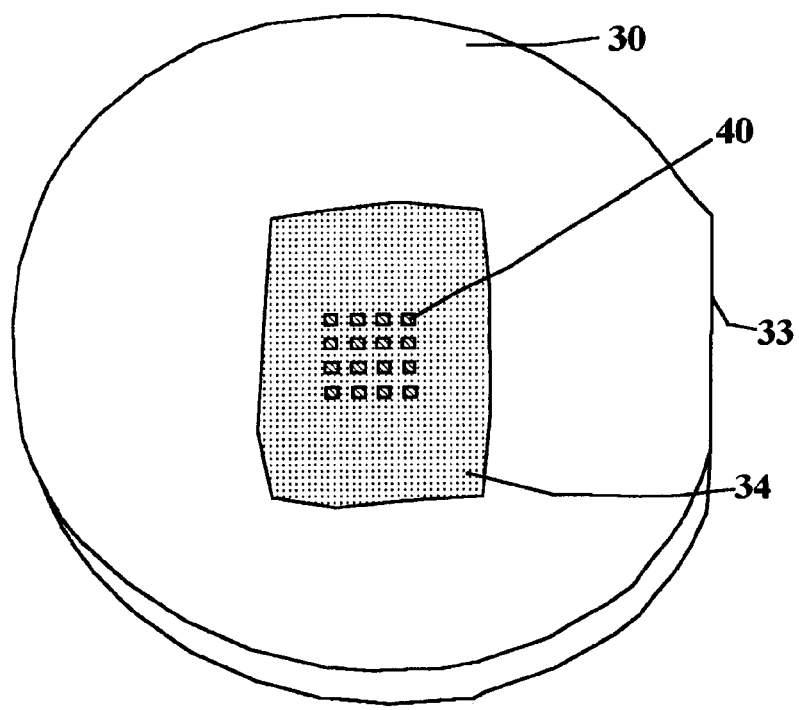
FIG. 10 is a plan view of the wafer of FIG. 9 with the overlapped exposure via areas of the line patterns in the photoresist portion developed and showing the underlying insulating layer to be etched.

In accordance with the present invention, the photoresist layer 34 is first exposed to a conventional deep ultra violet light pattern as shown by the four sets of arrows 35 in FIG. 4. For this exposure, the wafer in positioned in the photolithographic system with the flat 33 in the lower portion of the wafer and exposed as indicated by the sets of arrows in FIGS. 4 and 5. The resulting line exposure but not developed exposed areas 36 are shown in FIG. 6. Now, using the same light and mask pattern but with the wafer 30 rotated ninety degrees (90°) so that the flat 33 of the wafer is positioned on the right side as shown in FIG. 7, the photoresist is exposed as indicated by the sets of arrows 37 in FIGS. 8 and 9. Both of these exposures alone are insufficient to chemically convert the photoresist so that, during development, the photoresist can not be removed in the single exposed areas 38, but only in the combined smaller overlapped exposed areas 39 is the exposure dosage sufficient to chemically convert the photoresist to remove it during development as shown in FIG. 9. Upon development and removal of the photoresist in the areas 39 as shown in FIG. 10, the openings 40, which are smaller than each of the single exposure, serve as a mask for etching the insulating layer 31 which is now visible at the bottom of the opening.

Figure 11:
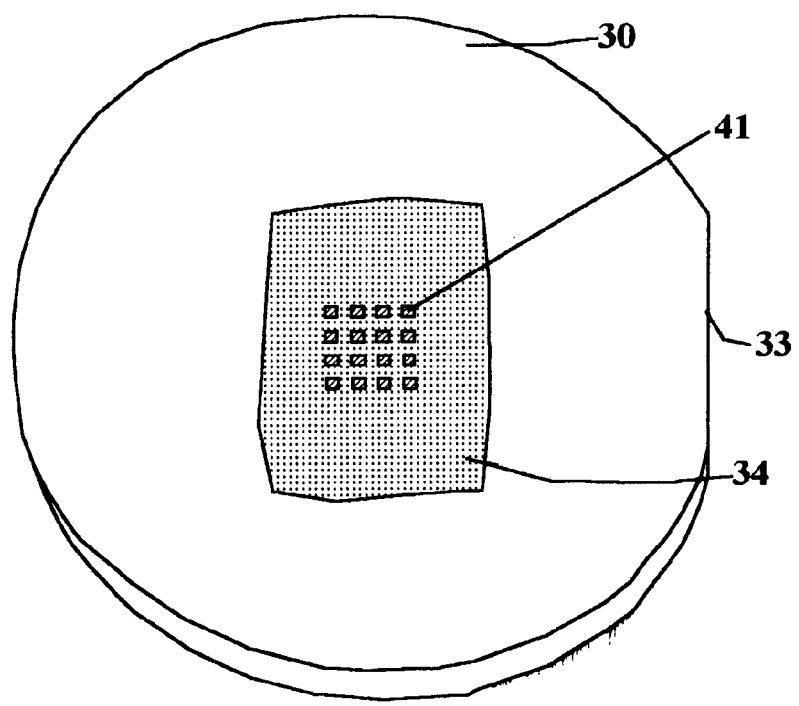
FIG. 11 is a plan view of the wafer of FIG. 10 with via areas in the photoresist portion used as a etchant mask for etching the insulating layer to the underlying conductive lines.

As shown in FIG. 11, the insulating layer 31 has been anisotrophically etched in a commercially available parallel plate plasma reactor (not shown), using CF4:H2 as the plasma gas for etching silicon oxide with the small photoresist openings 40 providing access to insulating layer 31 to create equivalent size openings in the insulating layer. In FIG. 11, the connecting lines 41 previously not shown are visible at the bottom of the openings 40. The openings 40 are filled with a conductive material, such as tungsten, aluminum, copper and polysilicon, as is well known in the art.

Although this invention has been described relative to specific materials, and semiconductor fabricating apparatus for forming integrated circuits on a wafer, it is not limited to the specific materials or apparatus but only to the specific structural characteristics of the integrated circuits and the method of fabricating such integrated circuits required for the present invention. Other materials and apparatus can be substituted for those described herein, which will be well understood by those skilled in the microelectronics and semiconductor arts after appreciating the present invention.

What is claimed is:

1. In a method of fabricating a via of an interconnecting line in an integrated circuit comprising the steps of:

forming at least one connecting line adjacent a semiconductor substrate;

forming an insulating layer on said connecting line;

forming a photoresist layer on said insulating layer;

exposing the photoresist layer to a first line exposure pattern of a dosage insufficient to develop the exposed pattern;

rotating the exposure pattern and the semiconductor substrate 90° relative to each other;

exposing the photoresist layer to a second overlapping line exposure pattern of a dosage insufficient to develop the exposed pattern while the semiconductor substrate is in the second position, the overlapping exposures creating via photoresist areas with the combined dosage being sufficient to develop the via photoresist areas; and developing the overlapping exposures of the via areas in the photoresist to create via openings smaller in the insulating layer than achievable by a single exposure.

2. The method of claim 1 wherein the insulating layer beneath the via area in the photoresist is etched to create a via opening in the insulating layer equivalent in size to the via area in the photoresist.

3. The method of claim 2 wherein the via opening in the insulating layer is filled with a conductive material.

4. The method of claim 2 wherein the via opening in the insulating layer is formed by anisotrophical etching.

5. The method of claim 3 wherein the via opening in the insulating layer is filled with doped polysilicon.

6. The method of claim 3 wherein the via opening in the insulating layer if filled with a metal.

7. The method of claim 1 wherein the semiconductor substrate is in a first position for exposure of the photoresist to the first exposure pattern.

8. The method of claim 1 wherein the semiconductor substrate is rotated 90° for exposure of the photoresist to the second exposure pattern.

* * * * *

UNITED STATES PATENT AND TRADEMARK OFFICE
CERTIFICATE OF CORRECTION

PATENT NO. : 6,358,843 B1
DATED : March 19, 2002
INVENTOR(S) : Babcock et al.

It is certified that error appears in the above-identified patent and that said Letters Patent is hereby corrected as shown below:

<u>Title page,</u>
Item [54], the title should read as follows:
-- METHOD OF MAKING ULTRA SMALL VIAS FOR INTEGRATED CIRCUITS --.

<u>Column 6,</u>
Line 19, please delete the word "if" and insert therefor -- is --.

Signed and Sealed this

Sixth Day of August, 2002

Attest:

JAMES E. ROGAN
Attesting Officer  Director of the United States Patent and Trademark Office